(12) United States Patent
Maekawa et al.

(10) Patent No.: US 10,886,170 B2
(45) Date of Patent: Jan. 5, 2021

(54) METHOD OF FORMING TUNGSTEN FILM (71) Applicant: Tokyo Electron Limited, Tokyo (JP)

(72) Inventors: Koji Maekawa, Yamanashi (JP); Takashi Sameshima, Yamanashi (JP); Shintaro Aoyama, Fuchu (JP); Mikio Suzuki, Nirasaki (JP); Susumu Arima, Nirasaki (JP); Atsushi Matsumoto, Nirasaki (JP); Naoki Shibata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/960,726

(22) Filed: Apr. 24, 2018

(65) Prior Publication Data

US 2018/0315649 A1    Nov. 1, 2018

(30) Foreign Application Priority Data

Apr. 26, 2017    (JP) .................................. 2017-087176

(51) Int. Cl.
| | |
|---|---|
| *H01L 21/768* | (2006.01) |
| *H01L 21/285* | (2006.01) |
| *H01L 23/532* | (2006.01) |

(52) U.S. Cl.
CPC .. *H01L 21/76868* (2013.01); *H01L 21/28556* (2013.01); *H01L 21/28562* (2013.01); *H01L 21/28568* (2013.01); *H01L 21/76876* (2013.01); *H01L 21/76877* (2013.01); *H01L 21/76895* (2013.01); *H01L 23/53257* (2013.01); *H01L 23/53266* (2013.01)

(58) Field of Classification Search
None
See application file for complete search history.

(56) References Cited

U.S. PATENT DOCUMENTS

| 6,066,366 A | * | 5/2000 | Berenbaum ............. C23C 16/14 |
|---|---|---|---|
| | | | 257/E21.17 |
| 2003/0038369 A1 | * | 2/2003 | Layadi ............. H01L 23/53266 |
| | | | 257/750 |

(Continued)

FOREIGN PATENT DOCUMENTS

| CN | 1788106 A | | 6/2006 |
|---|---|---|---|
| JP | H09-289248 | * | 11/1997 |

(Continued)

OTHER PUBLICATIONS

Machine-generated ENglish translation of JPH09289248, total pages 8 (Year: 1997).*

*Primary Examiner* — Bo B Jang (74) *Attorney, Agent, or Firm* — Pearne & Gordon LLP (57) ABSTRACT

A method of forming a tungsten film having low resistance is provided. The method includes forming a discontinuous film containing a metal on a substrate; and forming the tungsten film on the substrate on which the discontinuous film is formed. In the forming of the discontinuous film, a first source gas and a nitriding gas are supplied onto the substrate alternately along with, for example, a carrier gas. In the forming of the tungsten film, a second source gas and a reducing gas are supplied onto the substrate alternately along with, for example, a carrier gas.

9 Claims, 10 Drawing Sheets

(56) References Cited

U.S. PATENT DOCUMENTS

| | | | | |
|---|---|---|---|---|
| 2004/0025789 | A1* | 2/2004 | Yamasaki | C23C 16/16 |
| | | | | 118/715 |
| 2005/0250321 | A1* | 11/2005 | Hwang | H01L 21/28518 |
| | | | | 438/672 |
| 2015/0371991 | A1* | 12/2015 | Nobuto | H01L 27/10823 |
| | | | | 257/330 |
| 2016/0218219 | A1* | 7/2016 | Asami | H01L 29/0649 |

FOREIGN PATENT DOCUMENTS

| | | |
|---|---|---|
| JP | 2013-182961 A | 9/2013 |
| JP | 2014-067866 A | 4/2014 |
| JP | 2016-186094 A | 10/2016 |
| KR | 10-1999-0029260 A | 4/1999 |
| KR | 10-2014-0089646 A | 7/2014 |
| TW | 201501305 A | 1/2015 |

* cited by examiner

METHOD OF FORMING TUNGSTEN FILM

CROSS-REFERENCE TO RELATED APPLICATION

This application claims the benefit of Japanese Patent Application No. 2017-087176 filed on Apr. 26, 2017, the entire disclosures of which are incorporated herein by reference.

TECHNICAL FIELD

The embodiments described herein pertain generally to a method of forming a tungsten film.

BACKGROUND

In the manufacture of an electronic device such as a semiconductor device, a metal film is formed on a substrate. The metal film is used as, for example, a wiring layer. A tungsten film is widely known as such a metal film.

Various methods of forming a tungsten film have been used. In one method, the base film made of tungsten or titanium nitride is subjected to plasma treatment. Then, a tungsten film is formed on the surface of the base film modified by the plasma treatment. In another method, an initial tungsten film is formed on the base film made of titanium nitride. Next, a main tungsten film is formed on the initial tungsten film.

As stated above, the tungsten film is used as, for example, the wiring layer. Accordingly, the tungsten film needs to have low resistance.

SUMMARY

In one exemplary embodiment, there is provided a method of forming a tungsten film. The method includes forming a discontinuous film containing a metal on a substrate; and forming the tungsten film on the substrate on which the discontinuous film is formed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts are assigned same reference numerals.

Figure 1:
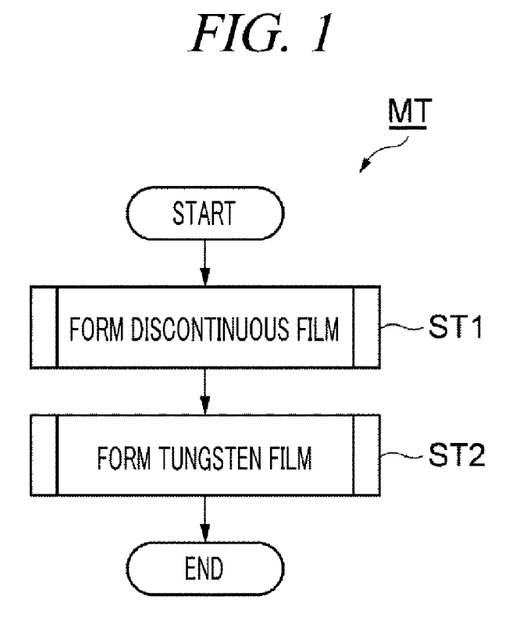
FIG. 1 is a flowchart for describing a method of forming a tungsten film according to an exemplary embodiment.

FIG. 1 is a flowchart for describing a method of forming a tungsten film according to an exemplary embodiment. A method MT shown in FIG. 1 is performed to form the tungsten film on a substrate. The tungsten film formed by the method MT may be used as a wiring layer, for example.

Figure 2:
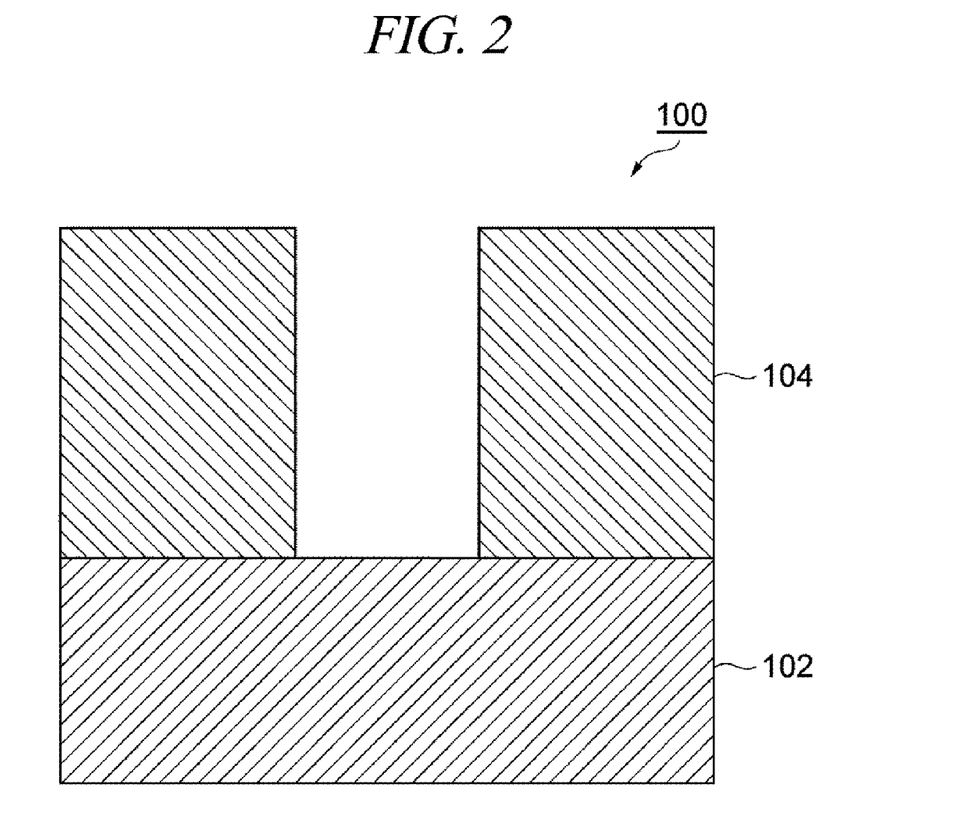
FIG. 2 is an enlarged cross sectional view illustrating a part of an example substrate to which the method shown in FIG. 1 is applicable.

FIG. 2 is an enlarged cross sectional view illustrating a part of an example substrate to which the method of FIG. 1 is applicable. A substrate 100 shown in FIG. 2 has a base layer 102 and an insulating layer 104. The insulating layer 104 is provided on the base layer 102. The insulating layer 104 is made of an insulating material such as silicon oxide. The insulating layer 104 is provided with an opening. The opening may be a hole or a groove.

Figure 3A:
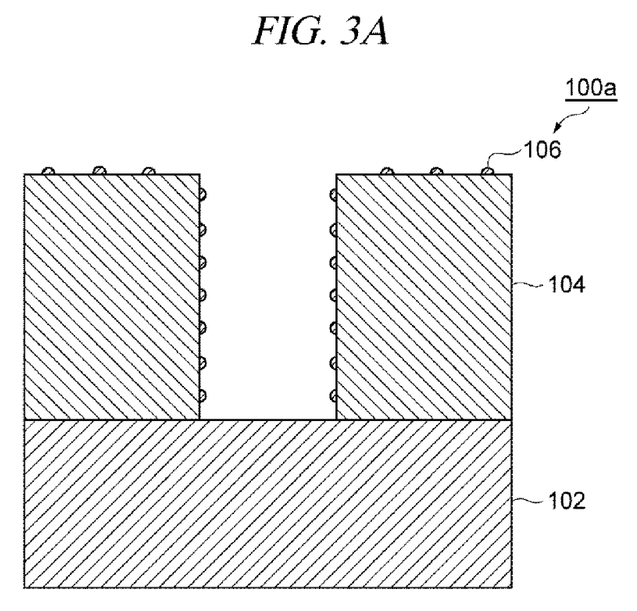
FIG. 3A is an enlarged cross sectional view illustrating the part of the example substrate after a process ST1 of the method shown in FIG. 1 is performed.
Figure 3B:
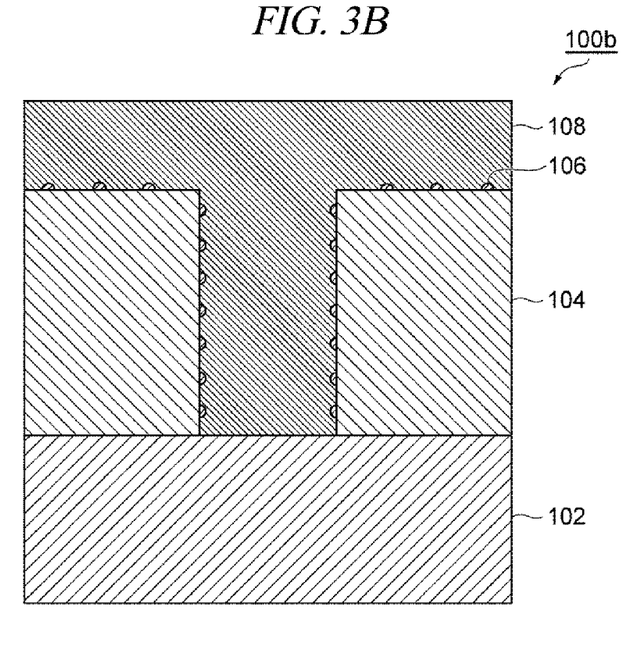
FIG. 3B is an enlarged cross sectional view illustrating the part of the example substrate after a process ST2 of the method shown in FIG. 1 is performed.

Now, the method MT will be described for an example case where the method MT is applied to the substrate 100. The method MT can be applied to any of various kinds of substrates on which a tungsten film needs to be formed. In the following description, reference is made to FIG. 3A and FIG. 3B in addition to FIG. 1. FIG. 3A is an enlarged cross sectional view illustrating a part of the example substrate after a process ST1 of the method shown in FIG. 1 is performed, and FIG. 3B is an enlarged cross sectional view illustrating the part of the example substrate after a process ST2 of the method shown in FIG. 1 is performed.

As depicted in FIG. 1, the method MT includes the process ST1 and the process ST2. In the process ST1, a discontinuous film 106 of a metal is formed on the substrate 100. In the process ST1, the discontinuous film 106 is formed by performing a film forming processing on the substrate 100 which is accommodated in a chamber. The discontinuous film 106 is composed of nuclei or islands of the metal formed at multiple positions on a surface of the substrate 100. That is to say, the discontinuous film 106 provides active sites formed on the substrate in the shape of dots. The discontinuous film 106 may be made of, by way of example, but not limitation, a titanium-containing material such as titanium nitride or a tungsten-containing material such as tungsten nitride.

Figure 4:
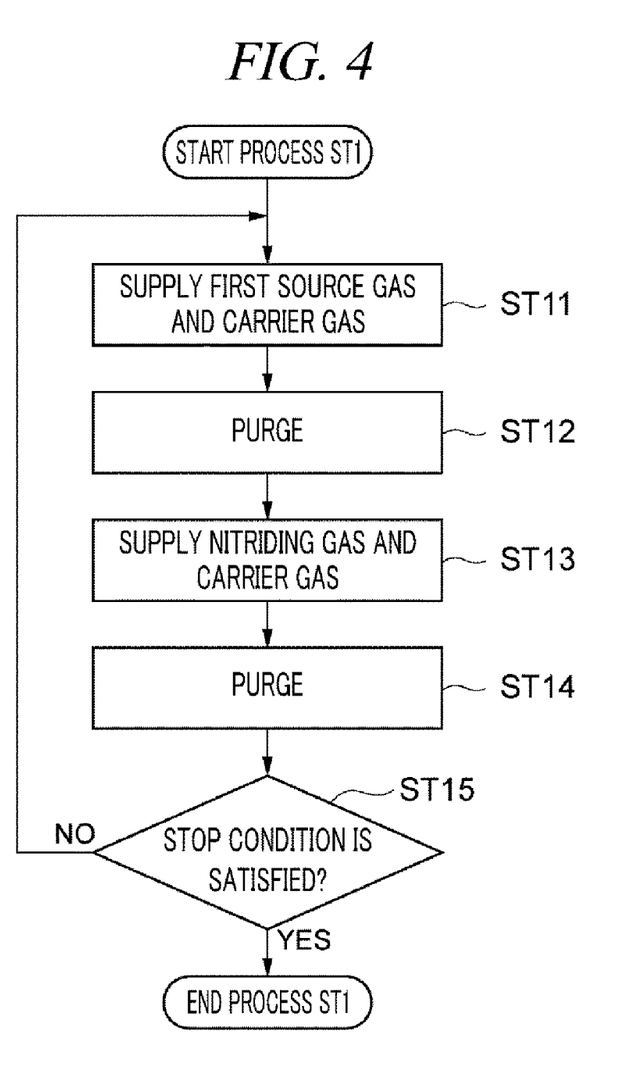
FIG. 4 is a flowchart showing an example of the process ST1 of the method shown in FIG. 1.

FIG. 4 is a flowchart for describing an example of the process ST1. In the process ST1 shown in FIG. 4, a first source gas and a nitride gas are supplied to the substrate 100 alternately along with a carrier gas. The process ST1 shown in FIG. 4 includes a process ST11 and a process ST13. The process ST1 shown in FIG. 4 may further include a process ST12 performed between the process ST11 and the process ST13 and a process ST14 performed between the process ST13 and the process ST11. In the process ST1 shown in FIG. 4, a sequence including the process ST11 to ST14 is performed a preset number of times (a preset number of cycles).

The process ST1 shown in FIG. 4 is performed in the state that the substrate 100 is accommodated in the chamber. In the process ST11, the first source gas and the carrier gas are supplied to the substrate 100. The first source gas contains a metal. The metal in the first source gas may be, by way of non-limiting example, titanium or tungsten. If the discontinuous film 106 contains the titanium as the metal, the first source gas may be, by way of example, a titanium tetrachloride ($TiCl_4$) gas. If the discontinuous film 106 contains the tungsten as the metal, the first source gas may be, but not limited to, a tungsten hexafluoride ($WF_6$) gas or a tungsten hexachloride ($WCl_6$) gas. The carrier gas is an inert gas. In the exemplary embodiment, the carrier gas may be a nitrogen ($N_2$) gas. Alternatively, however, the carrier gas may be a rare gas such as an argon gas. Through the process ST1, a first source material containing the metal in the first source gas is deposited on the surface of the substrate 100.

Example ranges of processing conditions in the process ST11 are specified below.

Flow rate of the first source gas in the process ST11: 20 sccm to 200 sccm

Flow rate of the carrier gas in the process ST11: 1000 sccm to 18000 sccm

Temperature of the substrate in the process ST11: 300° C. to 550° C.

Pressure of the chamber in the process ST11: 250 Pa to 1250 Pa

Processing time of the process ST11 in each cycle: 0.05 sec to 5 sec

In the subsequent process ST12, a purge of the chamber is performed. That is, the gas within the chamber is switched to a purge gas from the first source gas. The purge gas used in the process ST12 is an inert gas. The purge gas used in the process ST12 may be the same as the carrier gas used in the process ST11. That is, the same carrier gas may be continuously supplied into the chamber in the process ST11 and the process ST12. Furthermore, the same carrier gas may be supplied into the chamber while the process ST1 is being performed, that is, throughout the process ST11 to the process ST14.

In the subsequent process ST13, the nitriding gas is supplied to the substrate 100 along with the carrier gas. The nitriding gas may be, but not limited to, an ammonia ($NH_3$) gas. In the exemplary embodiment, the carrier gas is the nitrogen ($N_2$) gas. Alternatively, however, the carrier gas may be a rare gas such as an argon gas. Through the process ST13, the metal in the first source material existing on the substrate 100 is nitrided.

Example ranges of processing conditions in the process ST13 are specified as follows.

Flow rate of the nitriding gas in the process ST13: 1000 sccm to 9000 sccm

Flow rate of the carrier gas in the process ST13: 1000 sccm to 18000 sccm

Temperature of the substrate in the process ST13: 300° C. to 550° C.

Pressure of the chamber in the process ST13: 100 Pa to 1250 Pa

Processing time of the process ST13 in each cycle: 0.05 sec to 5 sec

In the subsequent process ST14, a purge of the chamber is performed. That is, the gas within the chamber is switched from the nitriding gas to a purge gas. The purge gas used in the process ST14 is an inert gas. The purge gas used in the process ST14 may be the same as the carrier gas used in the process ST13.

In the subsequent process ST15, it is determined whether a stop condition is satisfied. The stop condition is satisfied when a repetition number of the sequence including the processes ST11 to ST14 reaches a preset number of times (a preset number of cycles). The preset number of times may be in the range from, for example, but not limitation, 5 times to 20 times. If the stop condition is not satisfied, the process ST11 is performed again. If the stop condition is satisfied, on the other hand, the process ST1 is ended. Upon the completion of the process ST1, the discontinuous film 106 is formed on the substrate 100, as illustrated in FIG. 3A. Hereinafter, the substrate 100 having the discontinuous film 106 formed thereon will be referred to as "substrate 100a."

In the method MT, the process ST2 is performed subsequently. In the process ST2, a tungsten film 108 is formed on the substrate 100a, that is, on the substrate 100 on which the discontinuous film 106 is formed. In the process ST2, a film forming processing is performed on the substrate 100a within a chamber, so that the tungsten film 108 is formed. The chamber used in the process ST2 may be the same as or different from the chamber used in the process ST1. The tungsten film 108 formed in the process ST2 is a continuous film made of tungsten. That is, the tungsten film 108 is formed to cover the surface of the substrate 100a.

Figure 5:
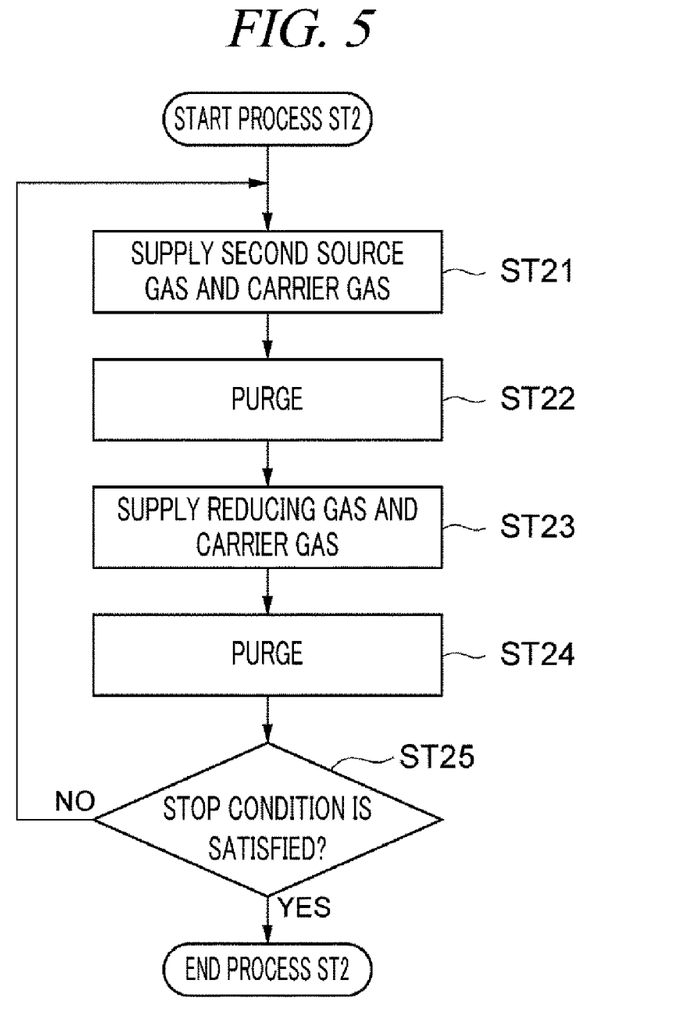
FIG. 5 is a flowchart showing an example of the process ST2 of the method shown in FIG. 1.

FIG. 5 is a flowchart for describing an example of the process ST2 of the method shown in FIG. 1. In the process ST2 shown in FIG. 5, a second source gas and a reducing gas are supplied to the substrate 100a alternately along with a carrier gas. The process ST2 shown in FIG. 5 includes a process ST21 and a process ST23. The process ST2 shown in FIG. 5 may further include a process ST22 performed between the process ST21 and the process ST23; and a process ST24 performed between the process ST23 and the process ST21. In the process ST2 shown in FIG. 5, a sequence including the processes ST21 to ST24 is performed a preset number of times (a preset number of cycles).

The process ST2 shown in FIG. 5 is performed in the state that the substrate 100a is accommodated in the chamber. In the process ST21, the second source gas and the carrier gas are supplied to the substrate 100a. The second source gas contains tungsten. The second source gas may be, by way of example, but not limitation, a tungsten hexafluoride ($WF_6$) gas or a tungsten hexachloride ($WCl_6$) gas. The carrier gas is an inert gas. In the exemplary embodiment, the carrier gas may be a rare gas such as an argon gas. Alternatively, however, the carrier gas may be a nitrogen ($N_2$) gas.

Through the process ST21, a second source material containing the tungsten in the second source gas is deposited on the substrate 100a.

Example ranges of processing conditions in the process ST21 are specified below.

Flow rate of the second source gas in the process ST21: 50 sccm to 450 sccm

Flow rate of the carrier gas in the process ST21: 1000 sccm to 9000 sccm

Temperature of the substrate in the process ST21: 300° C. to 550° C.

Pressure of the chamber in the process ST21: 100 Pa to 1250 Pa

Processing time of the process ST21 in each cycle: 0.05 sec to 5 sec

In the subsequent process ST22, a purge of the chamber is performed. That is, the gas within the chamber is switched to a purge gas from the second source gas. The purge gas used in the process ST22 is an inert gas. The purge gas used in the process ST22 may be the same as the carrier gas used in the process ST21. That is, the same carrier gas may be continuously supplied into the chamber in the process ST21 and the process ST22. Furthermore, the same carrier gas may be supplied into the chamber while the process ST2 is being performed, that is, throughout the process ST21 to the process ST24.

In the subsequent process ST23, the reducing gas is supplied to the substrate 100a along with the carrier gas. The reducing gas may be, but not limited to, a hydrogen ($H_2$) gas. Any of various reducing gases can be used here as long as an element (e.g., fluorine) other than the tungsten can be removed from the second source material. In the exemplary embodiment, the carrier gas is a rare gas such as an argon gas. Alternatively, the carrier gas may be a nitrogen ($N_2$) gas. Through the process ST23, the element in the second source other than the tungsten is removed, so that a tungsten film is formed on the substrate 100a.

Example ranges of processing conditions in the process ST23 are specified as follows.

Flow rate of the reducing gas in the process ST23: 500 sccm to 9000 sccm

Flow rate of the carrier gas in the process ST23: 1000 sccm to 9000 sccm

Temperature of the substrate in the process ST23: 300° C. to 550° C.

Pressure of the chamber in the process ST23: 100 Pa to 1250 Pa

Processing time of the process ST23 in each cycle: 0.05 sec to 5 sec

In the subsequent process ST24, a purge of the chamber is performed. That is, the gas within the chamber is switched from the reducing gas to a purge gas. The purge gas used in the process ST24 is an inert gas. The purge gas used in the process ST24 may be the same as the carrier gas used in the process ST23.

In the subsequent process ST25, it is determined whether a stop condition is satisfied. The stop condition is satisfied when the repetition number of the sequence including the processes ST21 to ST24 reaches the preset number of times (the preset number of cycles). Though the preset number of times depends on a film thickness of the tungsten film 108 to be formed, the preset number of times may be set to be in the range from, e.g., 30 times to 3000 times inclusive. If the stop condition is not satisfied, the process ST21 is performed again. If the stop condition is satisfied, on the other hand, the process ST2 is ended. Upon the completion of the process ST2, the tungsten film 108 is formed on the substrate 100a, so that a substrate 100b as illustrated in FIG. 3B is obtained.

If the tungsten film 108 is formed on the substrate 100 (substrate 100a) on which the aforementioned discontinuous film 106 is formed, a size of crystal grains of the corresponding tungsten film 108 is increased. Thus, according to the method MT, the tungsten film 108 having low resistance can be obtained.

In the example of the process ST1 of the method MT, the discontinuous film 106 is formed by performing the sequence including the process ST11 to ST14 the preset number of times. Accordingly, formation of the dot-shaped discontinuous film 106, that is, control of the film thickness of the discontinuous film 106 is easily performed.

As stated above, in the example of the process ST1, the nitrogen gas may be used as the carrier gas. If the nitrogen gas is used as the carrier gas, a particle size of the titanium nitride deposited on the substrate 100 in each sequence including the process ST11 to ST14 is decreased. Therefore, the aforementioned discontinuous film 106 can be formed easily.

As discussed above, in the example of the process ST2, the rare gas is used as the carrier gas. If the rare gas is, for example, the argon gas is used as the carrier gas in the process ST2, the size of the crystal grain of the tungsten in the tungsten film 108 is increased. Therefore, if the rare gas is used as the carrier gas, the tungsten film 108 having lower resistance can be obtained.

Figure 6:
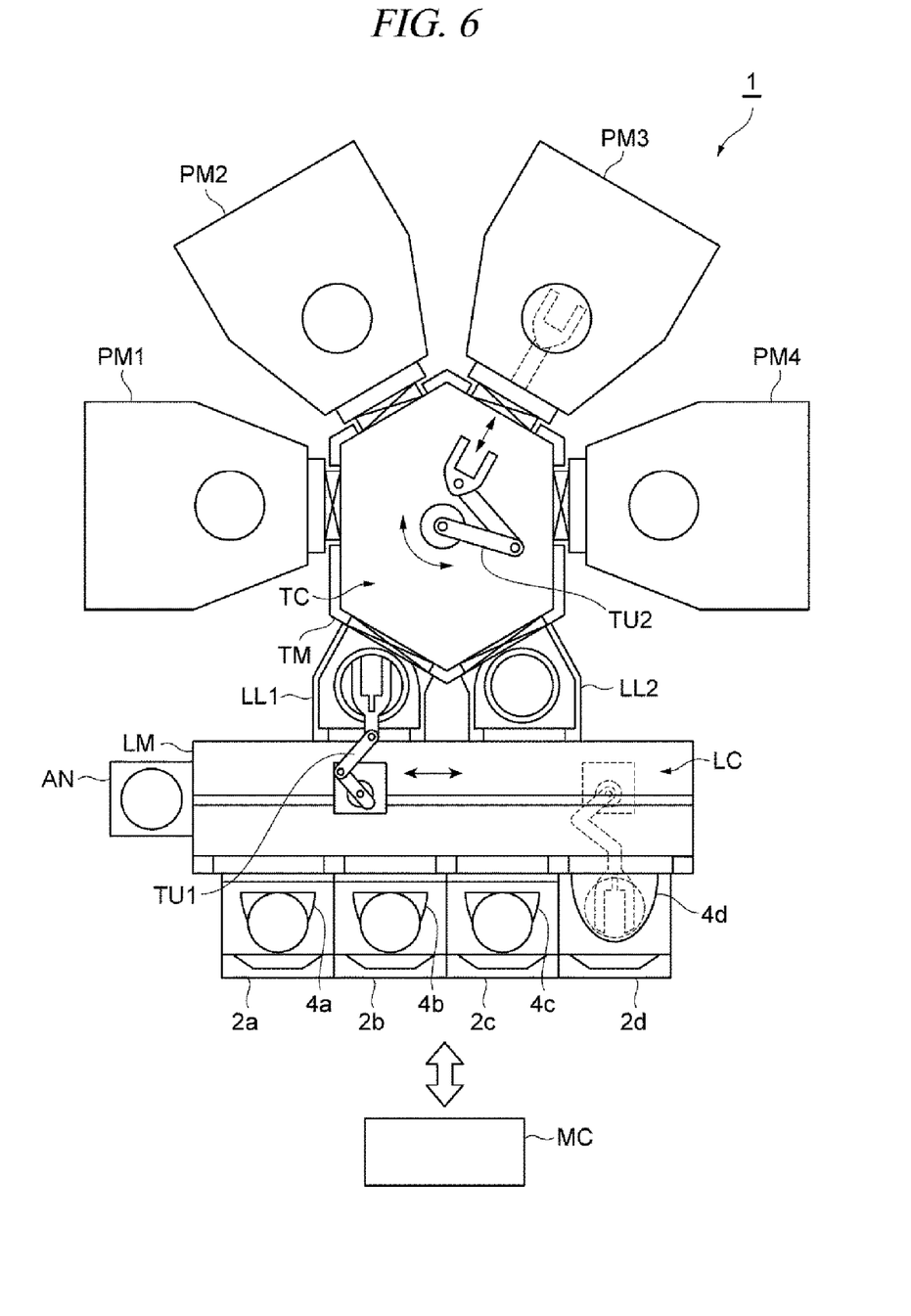
FIG. 6 is a diagram illustrating an example system which can be used to perform the method of FIG. 1.

Now, a processing system which can be used in carrying out the method MT will be described. FIG. 6 is a diagram illustrating an example processing system that can be used in performing the method of FIG. 1. The method MT can be performed by using the processing system shown in FIG. 6. A processing system 1 shown in FIG. 6 includes placing tables 2a to 2d, containers 4a to 4d, a loader module LM, an aligner AN, load lock modules LL1 and LL2, a transfer module TM, and process modules PM1 to PM4.

The placing tables 2a to 2d are arranged along one side of the loader module LM. The containers 4a to 4d are mounted on the placing tables 2a to 2d, respectively. Each of the containers 4a to 4d is configured to accommodate substrates W therein. Each of the containers 4a to 4d may be a receptacle called FOUP (Front-Opening unified Pod).

The loader module LM provides a chamber LC therein. A pressure of the chamber LC is set to an atmospheric pressure. The loader module LM has a transfer device TU1. The transfer device TU1 may be, for example, a multi-joint robot. The transfer device TU1 is configured to transfer substrates W via the chamber LC between each of the containers 4a to 4d and the aligner AN, between the aligner AN and each of the load lock modules LL1 and LL2, and between each of the load lock modules LL1 and LL2 and each of the containers 4a to 4d. The aligner AN is connected to the loader module LM. The aligner AN is configured to perform position adjustment of the substrate W therein.

The load lock modules LL1 and the LL2 are provided between the loader module LM and the transfer module TM. Each of the load lock modules LL1 and LL2 provides a preliminary decompression room. Respective gate valves are provided between the preliminary decompression rooms of the load lock modules LL1 and LL2 and the chamber LC.

The transfer module TM provides a chamber TC therein, and the chamber TC is configured to be decompressed. Respective gate valves are provided between the chamber TC and the load lock modules LL1 and LL2. The transfer module TM is equipped with a transfer device TU2. The transfer device TU2 may be, for example, a multi-joint robot. The transfer device TU2 is configured to transfer substrates W via the chamber TC between each of the load lock modules LL1, LL2 and each of the process modules PM1 to PM4 and between any two of the process modules PM1 to PM4.

Each of the process modules PM1 to PM4 is an apparatus configured to perform a preset substrate processing. Chamber of each of the process modules PM1 to PM4 is connected to the transfer chamber TC via the corresponding gate valve. Two of the process modules PM1 to PM4 are film forming apparatuses which can be respectively used in the process ST1 and the process ST2 of the method MT. When the method MT is performed, the process ST1 is conducted by using one of the two corresponding modules. After the process ST1 is performed, the substrate W is transferred from the one module to the other of the two corresponding modules through the chamber TC. Then, the process ST2 is performed by using the other process module. That is, according to the processing system 1, the method MT from the process ST1 to the process ST2 can be performed only in a decompressed environment.

The processing system 1 may further include a controller MC. The controller MC is configured to control the individual components of the processing system 1 when the method MT is performed. The controller MC may be implemented by a computer including a processor (e.g., CPU), a storage device such as a memory, an input/output interface for control signals, and so forth. The storage device stores therein control programs and recipe data. As the processor is operated according to the control programs and the recipe data, the control signals are sent to the individual components of the processing system 1. Through this operation of the controller MC, the method MT can be carried out.

Figure 7:
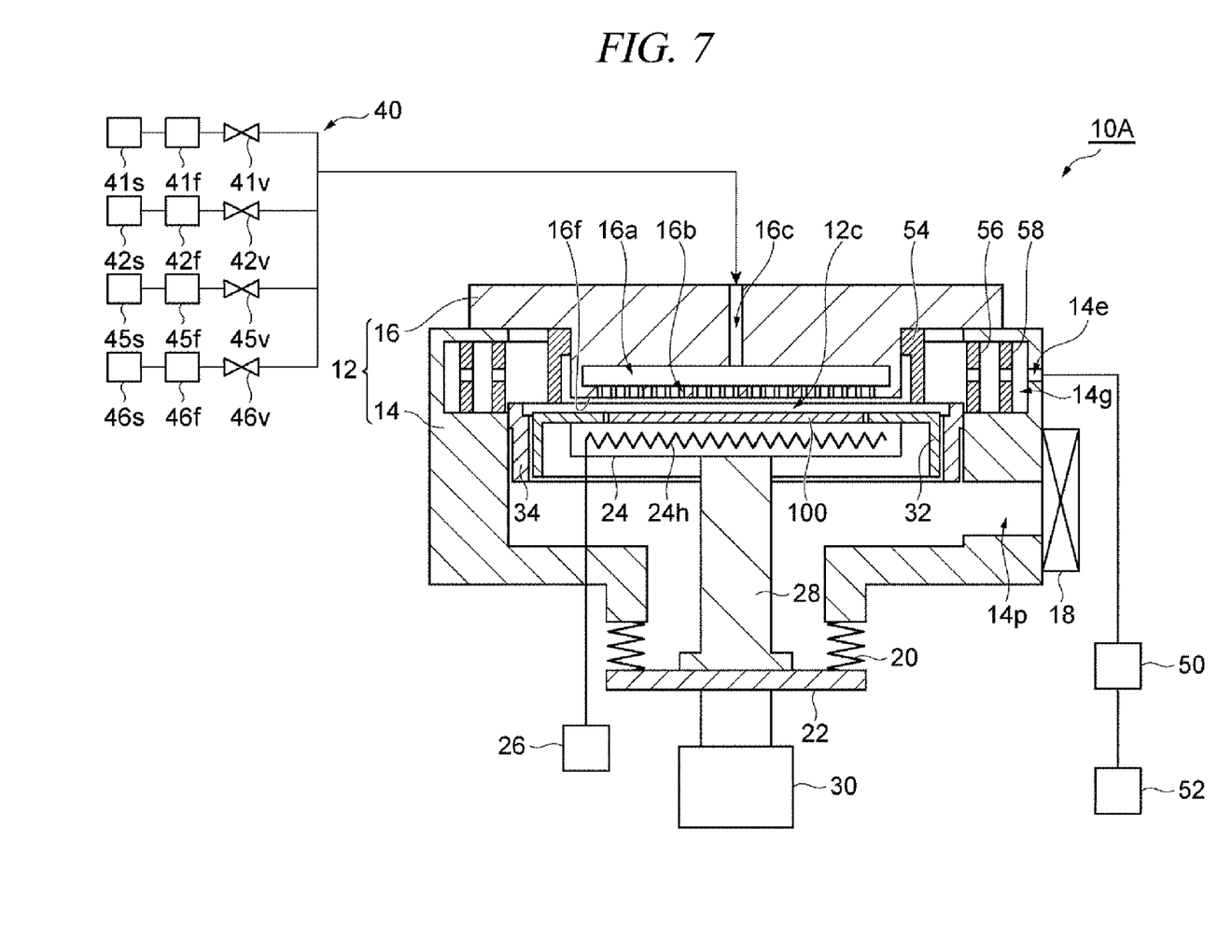
FIG. 7 is a diagram illustrating an example film forming apparatus which can be used to perform the method of FIG. 1.

Now, the film forming apparatus that can be used in performing the process ST1 will be explained. FIG. 7 is a diagram illustrating an example film forming apparatus that can be used in performing the method shown in FIG. 1. The process ST1 of the method MT can be carried out by using a film forming apparatus 10A shown in FIG. 7.

The film forming apparatus 10A includes a chamber main body 12. The chamber main body 12 provides an internal space thereof as a chamber 12c. The chamber main body 12 has a main portion 14 and a ceiling portion 16. The main portion 14 constitutes a sidewall of the chamber main body 12. The main portion 14 has a substantially cylindrical shape and is extended in a vertical direction. The main portion 14 is made of a metal such as, but not limited to, aluminum. A corrosion-resistant film is formed on an inner wall surface of the main portion 14.

An opening 14p, through which the substrate 100 is carried into or carried out of the chamber 12c, is formed at the sidewall of the main portion 14, i.e., the chamber main body 12. This opening 14p is configured to be opened/closed by a gate valve 18. A lower end of the main portion 14 is opened, and one end (upper end) of a bellows 20 is connected to this lower end of the main portion 14. The other end (lower end) of the bellows 20 is coupled to a cover body 22. The cover body 22 is a substantially plate-shaped member. The bellows 20 and the cover body 22 hermetically seal the opening at the lower end of the main portion 14 to achieve airtightness of the chamber 12c. Further, an upper end of the main portion 14 is opened, and the ceiling portion 16 is coupled to this upper end of the main portion 14. The ceiling portion 16 hermetically seals the opening at the upper end of the main portion 14 to achieve the airtightness of the chamber 12c. The ceiling portion 16 may be made of a metal such as, but not limited to, aluminum. A corrosion-resistant film is formed on an inner wall surface of the ceiling portion 16.

A stage 24 is provided within the chamber 12c. The stage 24 is of a substantially disk shape. The substrate 100 is placed on a top surface of the stage 24. A heater 24h is provided within the stage 24. The heater 24 is electrically connected to a heater power supply 26. The heater power supply 26 is provided outside the chamber main body 12.

One end (upper end) of a shaft body 28 is coupled to the stage 24. The shaft body 28 is extended downward from the stage 24. The other end (lower end) of the shaft body 28 is coupled to the cover body 22. The cover body 22 is connected with a driving unit 30 provided outside the chamber main body 12. The driving unit 30 is configured to move the stage 24 up and down via the cover body 22 and the shaft body 28. By way of example, the driving unit 30 may have a motor and a driving shaft coupled to the motor to move the stage 24 up and down.

A ring member 32 is provided to the stage 24. An upper portion of the ring member 32 is provided with a circular opening. The ring member 32 is provided to surround the substrate 100 placed on the stage 24 with the upper portion thereof. A cylindrical body 34 is provided to the sidewall of the main portion 14, i.e., the chamber main body 12. The cylindrical body 34 has a substantially cylindrical shape, and is provide outside the ring member 32 and within the chamber 12c. The cylindrical body 34 is coaxially arranged with respect to the ring member 32 so that a minute gap is provided between the cylindrical body 34 and the ring member 32.

The ceiling portion 16 includes a wall surface 16f which forms and confines the chamber 12c from thereabove. The wall surface 16f is extended above the stage 24, facing the top surface of the stage 24. This film forming apparatus 10A is configured such that a gap length between the top surface of the stage 24 and the wall surface 16f is adjustable by the aforementioned up-and-down movement of the stage 24.

A gas diffusion space 16a is formed within the ceiling portion 16. Further, the ceiling portion 16 is provided with a multiple number of gas discharge holes 16b. These gas discharge holes 16b are holes through which a gas supplied in the gas diffusion space 16a is discharged into the chamber 12c. The gas discharge holes 16b are extended from the gas diffusion space 16a to the wall surface 16f. Furthermore, a gas line 16c is formed in the ceiling portion 16. The gas line 16c is connected to the gas diffusion space 16a. This gas line 16c is connected with a gas supply system 40.

The gas supply system 40 is equipped with flow rate controllers 41f, 42f, 45f and 46f and valves 41v, 42v, 45v and 46v. Each of the flow rate controllers 41f, 42f, 45f and 46f may be implemented by a mass flow controller or a pressure control type flow rate controller.

A gas source 41s is connected to an input of the flow rate controller 41f. The gas source 41s is a source of the aforementioned first source gas. An output of the flow rate controller 41f is connected to the gas line 16c via the valve 41v. A gas source 42s is coupled to an input of the flow rate controller 42f. The gas source 42s is a source of the aforementioned nitriding gas. An output of the flow rate controller 42f is connected to the gas line 16c via the valve 42c.

A gas source 45s is connected to an input of the flow rate controller 45f. The gas source 45s is a source of the nitrogen gas which can be used as the carrier gas. An output of the flow rate controller 45f is connected to the gas line 16c via the valve 45v. A gas source 46s is coupled to an input of the flow rate controller 46f. The gas source 46s is a source of the rare gas (e.g., an argon gas) that can be used as the carrier gas. An output of the flow rate controller 46f is connected to the gas line 16c via the valve 46v. Further, the film forming apparatus 10A may not use the rare gas from the gas source 46s, so that the valve 46v and the flow rate controller 46f may be omitted.

The gas supply system 40 is configured to control a flow rate of a gas from one or more gas sources selected from the gas sources 41s, 42s, 45s and 46s, and supply the gas, whose flow rate is controlled, to the gas diffusion space 16a. The gas supplied into the gas diffusion space 16a is discharged from the gas discharge holes 16b toward the substrate 100.

The main portion 14, i.e., the sidewall of the chamber main body 12 is provided with a groove 14g which is extended in a circumferential direction with respect to a central axis of the main portion 14. A gas exhaust opening 14e is formed at this portion of the main portion 14 where the groove 14g is formed. The gas exhaust opening 14e is connected to a gas exhaust device 52 via a pressure control valve 50. The gas exhaust device 52 may be implemented by a vacuum pump such as a turbo molecular pump or a dry pump.

One or more baffle members are provided within the chamber 12c. As illustrated in FIG. 7, three baffle members 54, 56 and 58 are provided within the chamber 12c. Each of the three baffle members 54, 56 and 58 has a substantially cylindrical shape extended in the vertical direction. The three baffle members 54, 56 and 58 are coaxially arranged to be closer to a central side of the chamber 12c than the gas exhaust opening 14e is. An upper end of the baffle member 54 is coupled to the ceiling portion 16. A lower end of the baffle member 54 is positioned to face the ring member 32 such that a gap is provided between the lower end of the corresponding baffle member 54 and the ring member 32. The baffle member 56 and the baffle member 58 are provided within the groove 14g. The baffle member 56 is provided at an outside of the baffle member 54, and the baffle member 58 is provided at an outside of the baffle member 56. Each of the baffle members 56 and 58 is provided with a multiple number of through holes. These through holes formed at each of the baffle members 56 and 58 are arranged in the circumferential direction with respect to the central axis of the main portion 14.

In the film forming apparatus 10A, the gas discharged from the multiple number of gas holes 16b is supplied to the substrate 100, and is exhausted from the gas exhaust opening 14e through the gap between the baffle member 54 and the ring member 32, the multiple number of through holes of the baffle member 56 and the multiple number of through holes of the baffle member 58.

Figure 8:
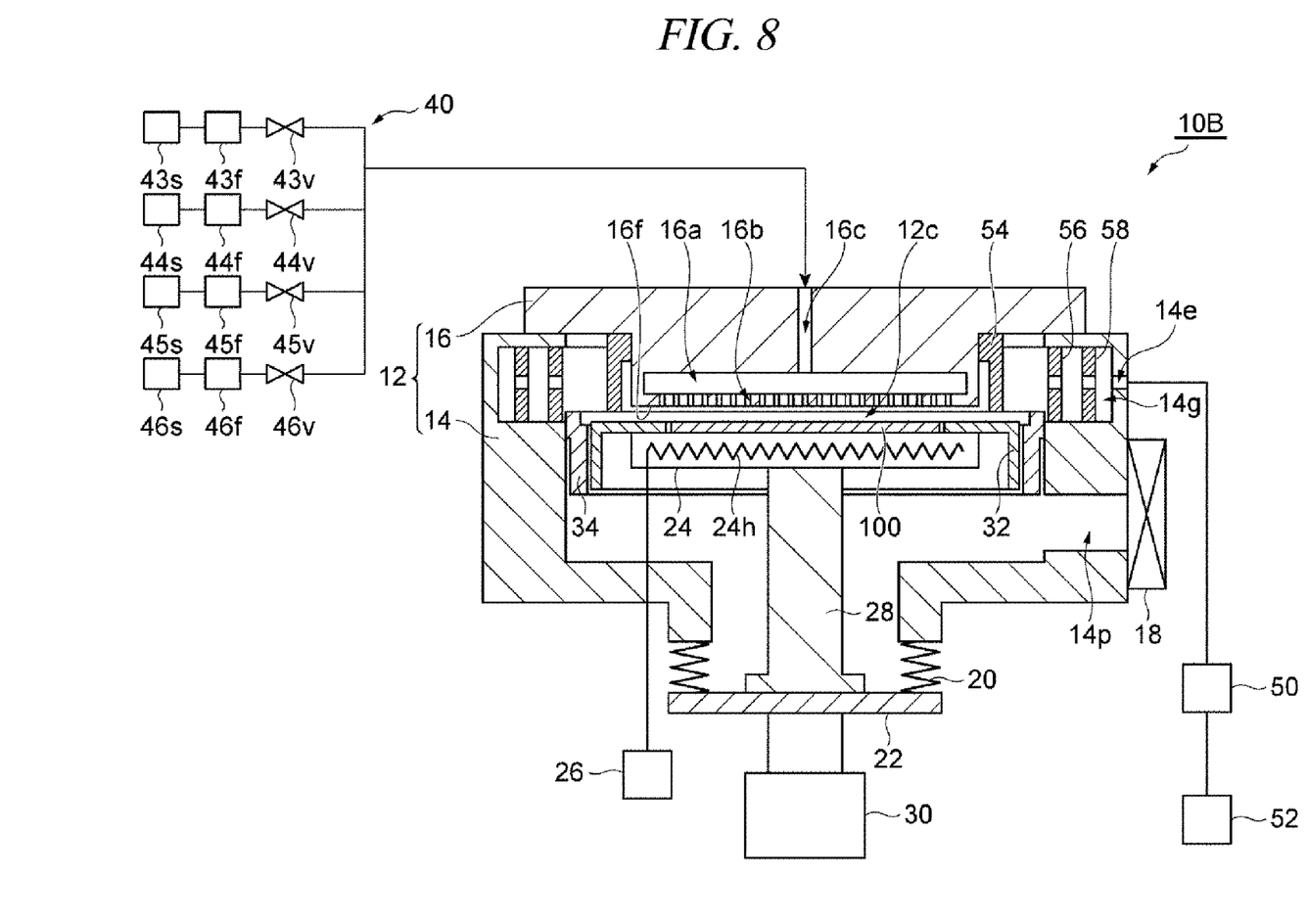
FIG. 8 is a diagram illustrating another example film forming apparatus which can be used to perform the method of FIG. 1.

Now, another film forming apparatus that can be used in performing the process ST2 of the method MT will be discussed. FIG. 8 is a diagram illustrating another example film forming apparatus that can be used in performing the method shown in FIG. 1. The process ST2 of the method MT can be carried out by using a film forming apparatus 10B shown in FIG. 8. This film forming apparatus 10B is different from the film forming apparatus 10A in that the gases from the gas sources 41s and 42s are not used, and valves 43v and 44v and flow rate controllers 43f and 44f are provided instead of the valves 41v and 42v and the flow rate controllers 41f and 42f.

Each of the flow rate controllers 43f and 44f may be implemented by a mass flow controller or a pressure control type flow rate controller. The gas source 43s is connected to an input of the flow rate controller 43f. The gas source 43s is a source of the aforementioned second source gas. An output of the flow rate controller 43f is connected to the gas line 16c via the valve 43v. The gas source 44s is coupled to an input of the flow rate controller 44f. The gas source 44s is a source of the aforementioned reducing gas. An output of the flow rate controller 44f is connected to the gas line 16c via the valve 44v. Further, the film forming apparatus 10B may not use the nitrogen gas from the gas source 45s so that the valve 45v and the flow rate controller 45f may be omitted.

Further, the process ST1 and the process ST2 of the method MT can be performed by a single film forming apparatus. By way of example, the process ST1 and the process ST2 of the method MT may be performed by using the film forming apparatus 10A which further includes the valves 43v and 44v and the flow rate controllers 43f and 44f to supply the gases from the gas sources 43s and 44s into the chamber 12c.

Hereinafter, a first experiment conducted to investigate a relationship between a repetition number (number of cycles) of the sequence including the processes ST11 to ST14 and resistivity of the tungsten film 108. In the first experiment, the process ST1 shown in FIG. 4 is performed on a plurality of substrates W having a flat surface by using the film forming apparatus 10A of the processing system 1, and then, the process ST2 shown in FIG. 5 is performed by using the film forming apparatus 10B of the processing system 1, so that the tungsten film is formed on each of the substrates W. In the first experiment, the repetition number (the number of the cycles) of the sequence in the process ST1 is set to be different between the substrates. Below, conditions for the process ST11, the process ST13, the process ST21 and the process ST23 in the first experiment are specified. Further, a repetition number (number of cycles) of the sequence including the process ST21 to ST24 is set to be 500 times.

Figure 9:
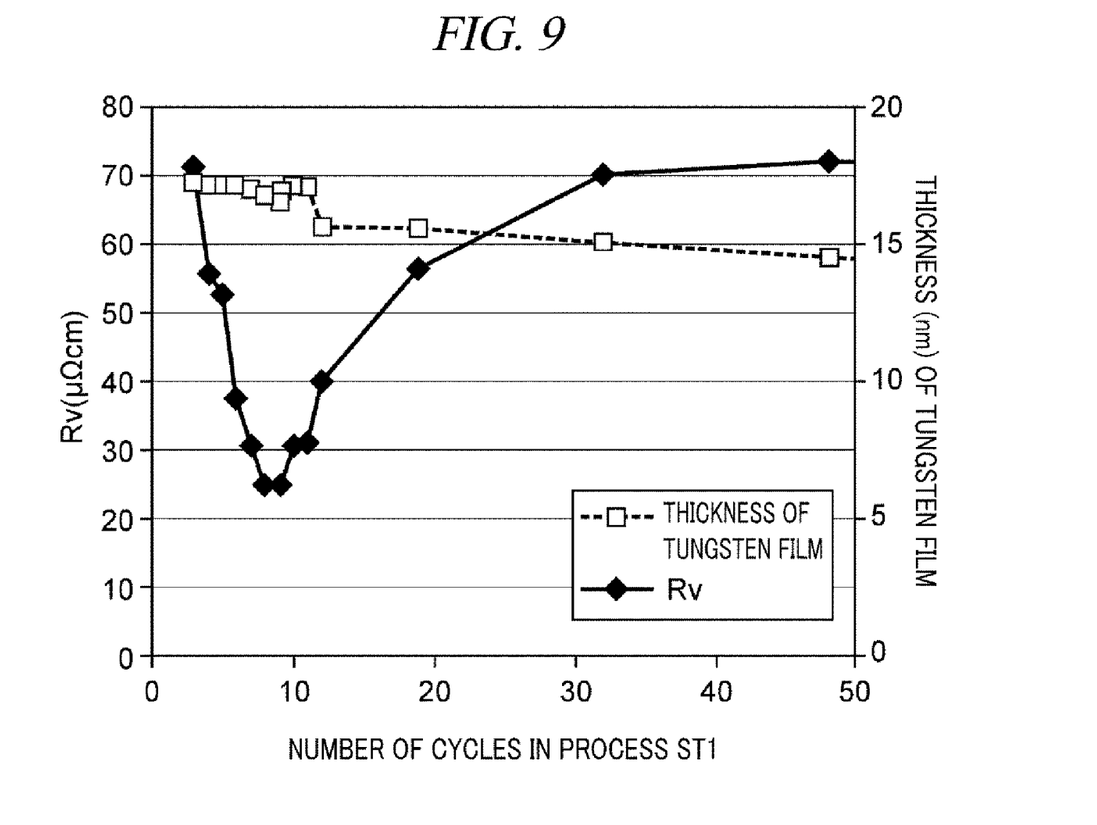
FIG. 9 is a graph showing a first experimental result.

<Conditions for Process ST11>
Flow rate of $TiCl_4$ gas in the process ST11: 50 sccm
Flow rate of $N_2$ gas in the process ST11: 6000 sccm
Temperature of the substrate in the process ST11: 460° C.
Pressure of the chamber in the process ST11: 400 Pa
Processing time of the process ST11 in each cycle: 0.05 sec <Conditions for Process ST13>
Flow rate of $NH_3$ gas in the process ST13: 2700 sccm
Flow rate of $N_2$ gas in the process ST13: 6000 sccm
Temperature of the substrate in the process ST13: 460° C.
Pressure of the chamber in the process ST13: 400 Pa
Processing time of the process ST13 in each cycle: 0.3 sec <Conditions for Process ST21>
Flow rate of $WF_6$ gas in the process ST21: 180 sccm
Flow rate of argon gas in the process ST21: 6000 sccm
Temperature of the substrate in the process ST21: 450° C.
Pressure of the chamber in the process ST21: 500 Pa
Processing time of the process ST21 in each cycle: 0.15 sec <Conditions for Process ST23>
Flow rate of $H_2$ gas in the process ST23: 4500 sccm
Flow rate of argon gas in the process ST23: 6000 sccm
Temperature of the substrate in the process ST23: 450° C.
Pressure of the chamber in the process ST23: 500 Pa
Processing time of the process ST23 in each cycle: 0.3 sec In the first experiment, the resistivity Rv of the tungsten film formed on each of the substrates is measured. FIG. 9 is a graph showing a result of the first experiment. On the graph of FIG. 9, a horizontal axis represents the repetition number (the number of the cycles) of the sequence in the process ST1; a vertical axis on the left indicates the resistivity Rv of the tungsten film; a vertical axis on the right indicates a thickness of the tungsten film. As can be seen from FIG. 9, in case that the repetition number (the number of the cycles) of the sequence in the process ST1 is small, the resistivity Rv of the formed tungsten film is relatively increased. This is deemed to be because the size of the crystal grain of the tungsten film is reduced as the discontinuous film is not formed on the substrate. Further, if the repetition number (the number of the cycles) of the sequence in the process ST1 reaches equal to or more than 30 times, the resistivity Rv of the formed tungsten film is found to be increased. This is deemed to be because the size of the crystal grain of the formed tungsten film is small as the continuous film, not the discontinuous film, is formed. Meanwhile, if the repetition number (the number of the cycles) of the sequence in the process ST1 is in the range from 5 times to 20 times, the resistivity Rv of the formed tungsten film is decreased. It is deemed to be because the size of the crystal grain of the tungsten film is increased as the discontinuous film is formed in the process ST1. As a result, it is found out that by forming the tungsten film after forming the discontinuous film on the substrate, the tungsten film having lower resistance can be obtained.

Now, a second experiment conducted to investigate the repetition number (the number of the cycles) of the sequence in the process ST1 and a thickness of a TiN film will be explained. In the second experiment, the process ST1 is performed on a plurality of substrates having a flat surface by using the film forming apparatus 10A. The repetition number (the number of the cycles) of the sequence in the process ST1 is set to be different between the substrates. Conditions for the process ST11 and the process ST13 in the second experiment are as follows.

Figure 10:
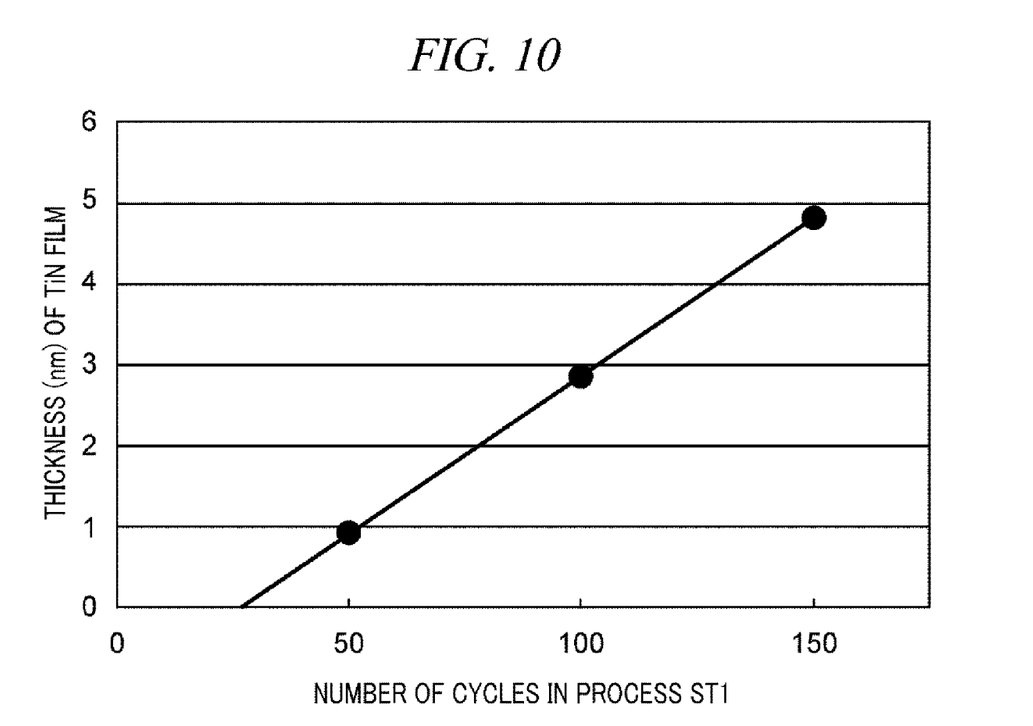
FIG. 10 is a graph showing a second experimental result.

<Conditions for Process ST11>
Flow rate of $TiCl_4$ gas in the process ST11: 50 sccm
Flow rate of $N_2$ gas in the process ST11: 6000 sccm
Temperature of the substrate in the process ST11: 460° C.
Pressure of the chamber in the process ST11: 500 Pa
Processing time of the process ST11 in each cycle: 0.05 sec <Conditions for Process ST13>
Flow rate of $NH_3$ gas in the process ST13: 2700 sccm
Flow rate of $N_2$ gas in the process ST13: 6000 sccm
Temperature of the substrate in the process ST13: 460° C.
Pressure of the chamber in the process ST13: 500 Pa
Processing time of the process ST13 in each cycle: 0.3 sec In the second experiment, the thickness of the TiN film formed on each of the substrates is measured. FIG. 10 provides a graph showing a result of the second experiment. On the graph of FIG. 10, a horizontal axis represents the repetition number (the number of the cycles) of the sequence in the process ST1, and a vertical axis indicates the thickness of the formed TiN film. As can be seen from the graph of FIG. 10, it is deemed that the thickness of the TiN film becomes substantially zero when the number of the cycles of the process ST1 is equal to or less than 27 times. That is, when the number of the cycles of the process ST1 is equal to or less than 27 times, the continuous film of TiN is not formed but the discontinuous film thereof is formed. Accordingly, it is found out that the discontinuous film is formed if the number of cycles is in the range from 5 times to 20 times which is the number of cycles in the process ST1 when the tungsten film having the lower resistance is formed as stated above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A method of forming a tungsten film, comprising:
forming a discontinuous film composed of nuclei or islands of a metal formed at multiple positions on a substrate in shape of dots; and
forming the tungsten film directly on an exposed surface of the substrate and directly on the discontinuous film formed in the shape of dots,
wherein the discontinuous film contains titanium nitride.

2. The method of claim 1,
wherein the forming of the discontinuous film comprises supplying, along with a carrier gas, a first source gas containing the metal and a nitriding gas alternately onto the substrate.

3. The method of claim 2,
wherein the first source gas is a titanium tetrachloride gas.

4. The method of claim 2,
wherein the nitriding gas is an ammonia gas.

5. The method of claim 2,
wherein the carrier gas is a nitrogen gas.

6. The method of claim 1,
wherein the forming of the tungsten film comprises supplying, along with a carrier gas, a second source gas containing tungsten and a reducing gas alternately onto the substrate on which the discontinuous film is formed.

7. The method of claim 6,
wherein the second source gas is a tungsten hexafluoride gas.

8. The method of claim 6,
wherein the reducing gas supplied in the forming of the tungsten film is a hydrogen gas.

9. The method of claim 6,
wherein the carrier gas supplied in the forming of the tungsten film is a rare gas.

* * * * *